United States Patent
Imai (10) Patent No.: US 7,629,567 B2
(45) Date of Patent: Dec. 8, 2009

(54) LIGHT RECEIVING CIRCUIT HAVING TWO SWITCHED PHOTODIODES

(75) Inventor: Hitoshi Imai, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/971,225

(22) Filed: Jan. 9, 2008

(65) Prior Publication Data

US 2008/0179492 A1    Jul. 31, 2008

(30) Foreign Application Priority Data

Jan. 29, 2007    (JP) ............................ 2007-017787

(51) Int. Cl.
*G01J 1/44* (2006.01)
*H01L 31/00* (2006.01)
(52) U.S. Cl. ................................ 250/214 R; 250/214.1
(58) Field of Classification Search ............. 250/214 A, 250/214 AG, 214 R, 214.1, 214 SW, 201.5; 330/308; 369/13.28, 13.32, 47.23, 47.24, 369/47.25, 134
See application file for complete search history.

(56) References Cited

U.S. PATENT DOCUMENTS

| | | | | |
|---|---|---|---|---|
| 5,981,936 A | * | 11/1999 | Fujiie | 250/214 A |
| 6,818,879 B2 | * | 11/2004 | Yamaguchi et al. | 250/214 A |
| 7,408,143 B2 | * | 8/2008 | Yokoyama | 250/214 R |
| 7,442,913 B2 | * | 10/2008 | Fukuda et al. | 250/214 A |
| 2006/0054789 A1 | * | 3/2006 | Miyamoto et al. | 250/214 A |
| 2006/0291348 A1 | * | 12/2006 | Nakamura | 369/47.24 |
| 2007/0075223 A1 | * | 4/2007 | Murao et al. | 250/214 A |

FOREIGN PATENT DOCUMENTS

| | | |
|---|---|---|
| JP | 2002-84149 | 3/2002 |
| JP | 2006-109434 | 4/2006 |

* cited by examiner

*Primary Examiner*—Que T Le
*Assistant Examiner*—Pascal M Bui-Pho
(74) *Attorney, Agent, or Firm*—Young & Thompson (57) ABSTRACT

A light receiving circuit includes a first light receiving element converting an input light to an electric current to output the electric current, a current-voltage conversion circuit converting the electric current to an electric voltage to output the electric voltage, a first switch element connected between the first light receiving element and the current-voltage conversion circuit, and a first current supply element connected between a first voltage source and the first light receiving element and forming an electric current path from the first voltage source to the first light receiving element.

7 Claims, 8 Drawing Sheets

PRIOR ART

Fig. 8

LIGHT RECEIVING CIRCUIT HAVING TWO SWITCHED PHOTODIODES

BACKGROUND OF THE INVENTION

1. Field of the Invention

The present invention relates to a light receiving circuit, more particularly, to a light receiving circuit that converts a photocurrent generated in a photodiode to a voltage signal to output the generated voltage signal.

2. Description of Related Art

In recent years, an optical disk device capable of writing data to an optical disk medium (CD (Compact Disk) or DVD (Digital Video Disk) and soon) and reading data from the optical disk medium has been widely used. Inside the optical disk device, a photodiode is provided for converting a reflected laser light, which is used for reading/writing data, to a photocurrent. This current signal generated by the photodiode is converted to a voltage signal by an IV converter (equivalent to a current-voltage conversion circuit). This generated voltage signal is output from the IV converter.

When the light receiving circuit is used in the optical disk device for two different standards of CD/DVD, it is required for the light receiving circuit to be capable of switching two photodiodes. This is because a two-wavelength laser is often used in the optical disk device for two different standards of CD/DVD.

Figure 6:
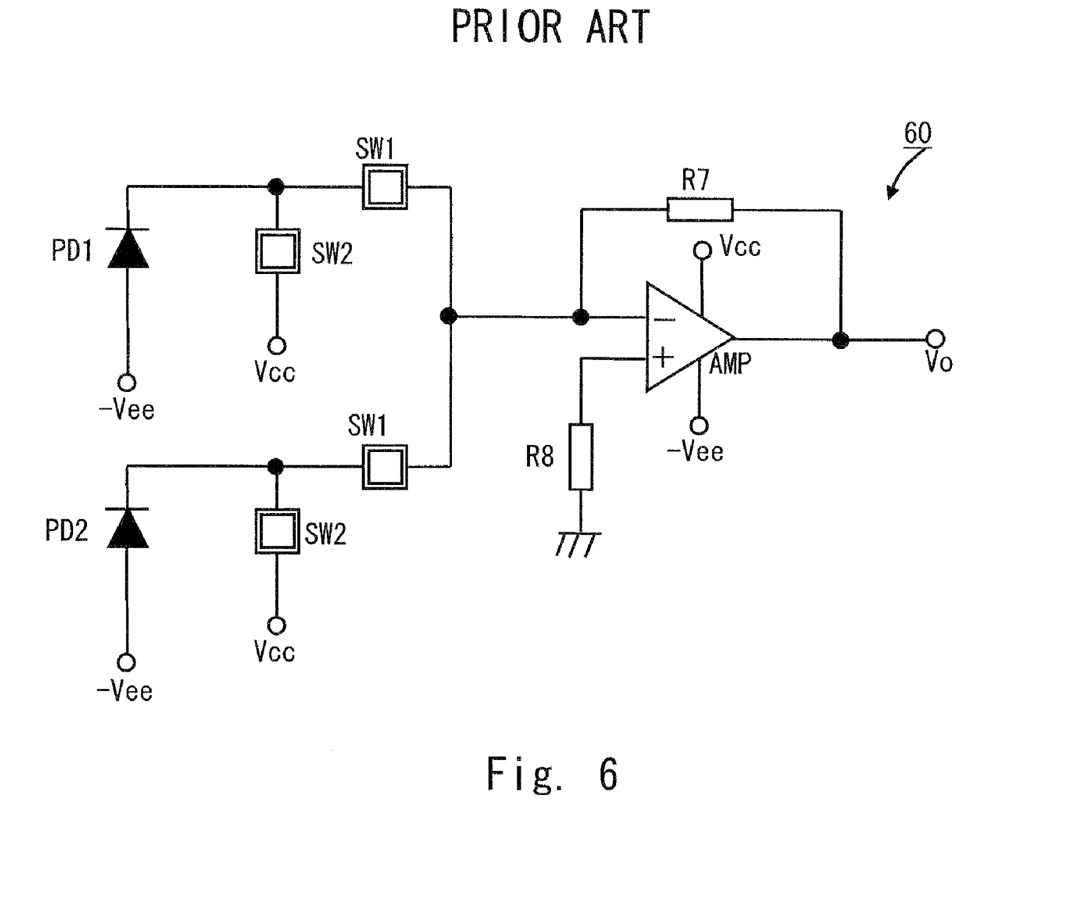
FIG. 6 is a schematic circuit diagram of a conventional light receiving circuit.

A light receiving circuit capable of switching two photodiodes is disclosed in Japanese Unexamined Patent Application Publication No. 2006-109434 (hereinafter referred to as prior art 1) as shown in FIG. 6.

As shown in FIG. 6, two branches are connected to a common IV converter. Each of the branches (branch circuits) has a photodiode, a first switch SW1, and a second switch SW2. The photodiode and the first switch SW1 are connected in series at each branch. The second switch SW2 is connected to a node between the photodiode and the first switch SW1 at each branch. The first switches SW1 are connected to the IV converter in parallel.

In this light receiving circuit 60, a complementary operation is performed between the first and second switches at each branch. That is, the first switch SW1 is in ON state when the second switch SW2 is in OFF state, and the first switch SW1 is in OFF state when the second switch SW2 is in ON state. By adopting this complementary operation, an undesired influence on the IV converter which is caused when a light is input to the photodiode that is not selected (hereinafter also referred to as an ineffective photodiode) is avoided.

Figure 8:
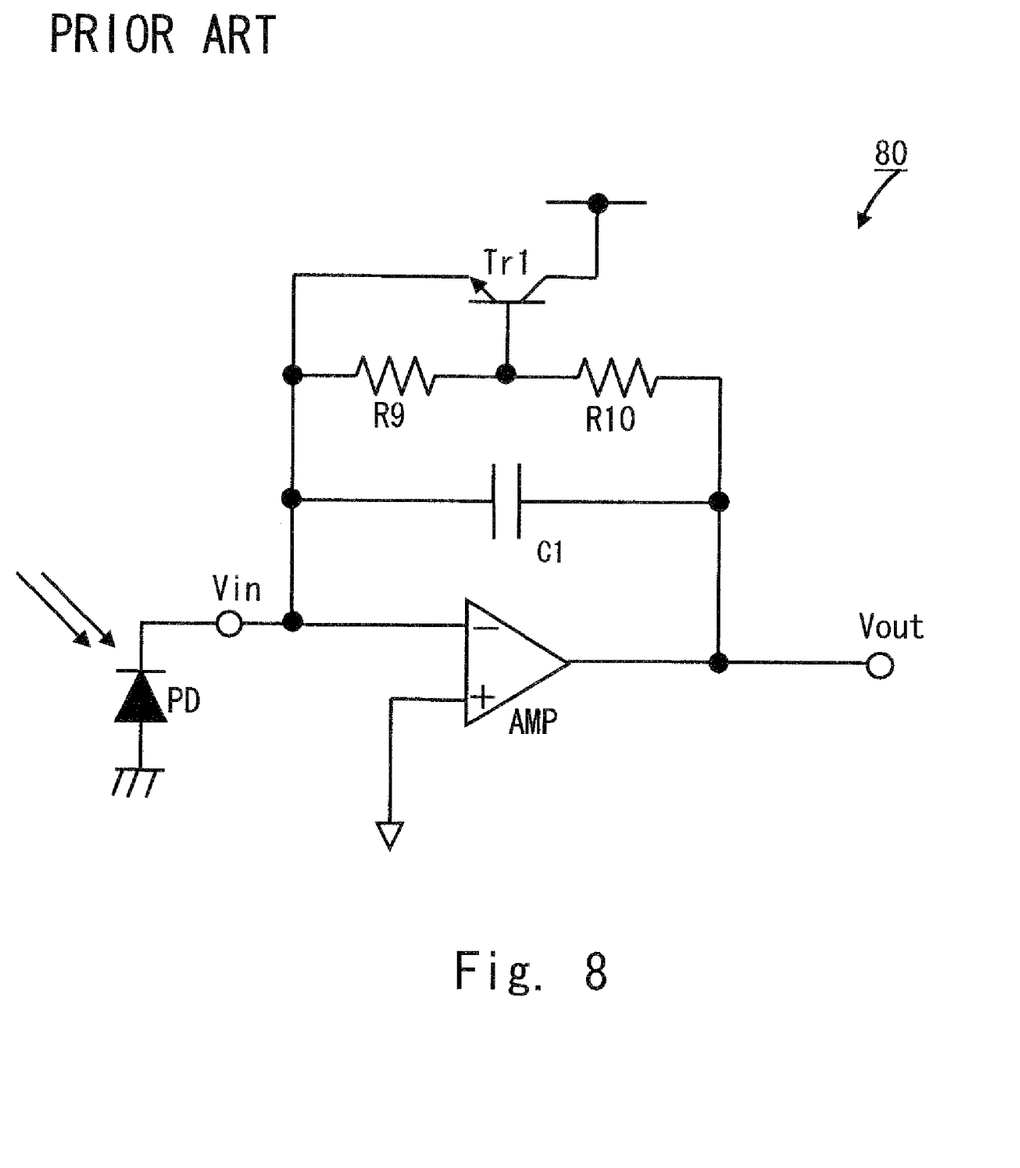
FIG. 8 is a schematic circuit diagram of a conventional trans-impedance amplifier.

A trans-impedance amplifier disclosed in Japanese Unexamined Patent Application Publication No. 2002-84149 (hereinafter referred to as prior art 2) is shown in FIG. 8. As shown in FIG. 8, the trans-impedance amplifier 80 has an amplifier AMP having feedback resistors R9 and R10 connected in series between input and output terminals thereof. The amplifier AMP converts an input current from a photodiode connected to the input terminal thereof to a voltage and outputs the generated voltage from the output terminal thereof.

In this trans-impedance amplifier 80, a negative feedback current is supplied to a signal input terminal side of the amplifier AMP when the input current generated in the photodiode PD becomes equal to or above a predetermined level. More specifically, an operational point for turning on an NPN transistor Tr1 connected to VCC and an output clipped voltage are determined by a resistance ratio between resistors R9 and R10. By adopting this configuration, stable and safe operation is achieved even if a large amount of photocurrent is generated in the photodiode PD.

Figure 7:
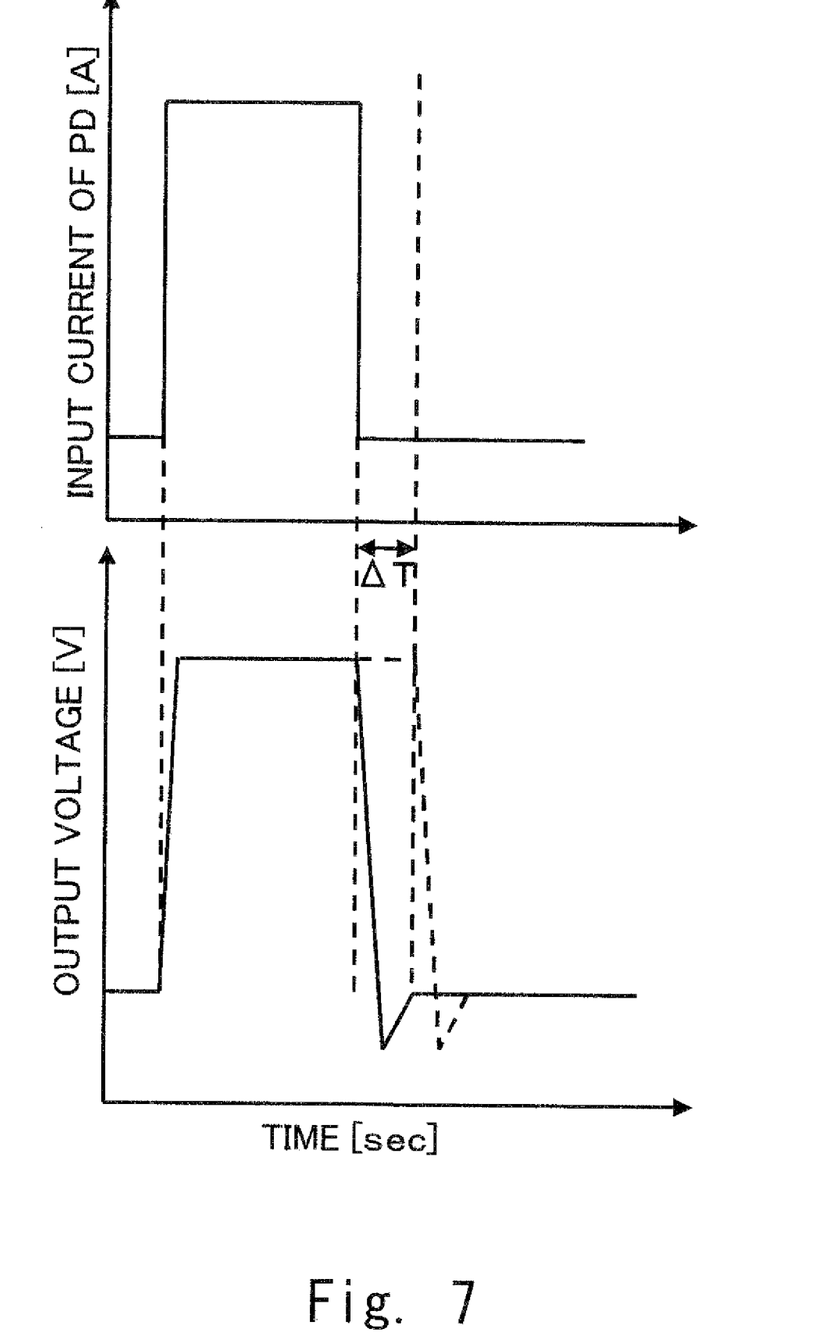
FIG. 7 is a schematic waveform chart showing an input current waveform from a photodiode and an output voltage waveform of an IV converter of a conventional light receiving circuit.

Still though, it is not achieved to solve problems explained below simultaneously by the prior art 1 or the prior art 2 in case that a plurality of photodiodes are provided in the light receiving circuit. In the prior art 1, a cathode potential of the photodiode lowers when a photocurrent over a certain level enough for saturating the output voltage of the IV converter is input to the IV converter. In addition, a certain period of time is required for recovering the cathode potential, and a delay is caused in a recovery characteristic of the output voltage of the IV converter when the input photocurrents are switched as shown in FIG. 7.

On the other hand, in the prior art 2, the undesired influence is applied to the IV converter which is caused by the photocurrent that is generated when the light is input to the ineffective photodiode.

As explained above, the undesired influence on the IV converter caused by the over-saturated state and the undesired influence on the IV converter caused by the photocurrent generated when the light is input to the ineffective photodiode have not been solved simultaneously.

SUMMARY

In one embodiment, a light receiving circuit includes a first light receiving element converting an input light to an electric current to output the electric current, a current-voltage conversion circuit converting the electric current to an electric voltage to output the electric voltage, a first switch element connected between the first light receiving element and the current-voltage conversion circuit, and a first current supply element connected between a first voltage source and the first light receiving element and forming an electric current path from the first voltage source to the first light receiving element.

In another embodiment, a light receiving circuit includes a current-voltage conversion circuit, first and second photodiodes, a first switch connected between the first photodiode and an input terminal of the current-voltage conversion circuit, a second switch connected between the second photodiode and the input terminal, a first bipolar transistor in which an emitter thereof is connected to a node between the first switch and the first photodiode, a base thereof is connected to a second voltage source, and a collector thereof is connected to a first voltage source, and a second bipolar transistor in which an emitter thereof is connected to a node between the second switch and the second photodiode, a base thereof is connected to the second voltage source, and a collector thereof is connected to the first voltage source.

According to the embodiments of the light receiving circuit of the present invention, when the current-voltage conversion circuit outputs a saturated voltage, it is achieved to suppress the undesired influence caused by the over-saturated state of the first light receiving element. It is also achieved to suppress the undesired influence such as noise and so on against the current-voltage conversion circuit even if the first light receiving element changes a mode from an ineffective mode to an effective mode as a result of the switching of light receiving elements.

According to the aspects of the present invention, it is achieved to avoid both of the undesired influences including the undesired influence on a current-voltage conversion circuit which is caused by the over-saturated state and the undesired influence on a current-voltage conversion circuit which is caused by a photocurrent generated when the light is input to an ineffective photodiode.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
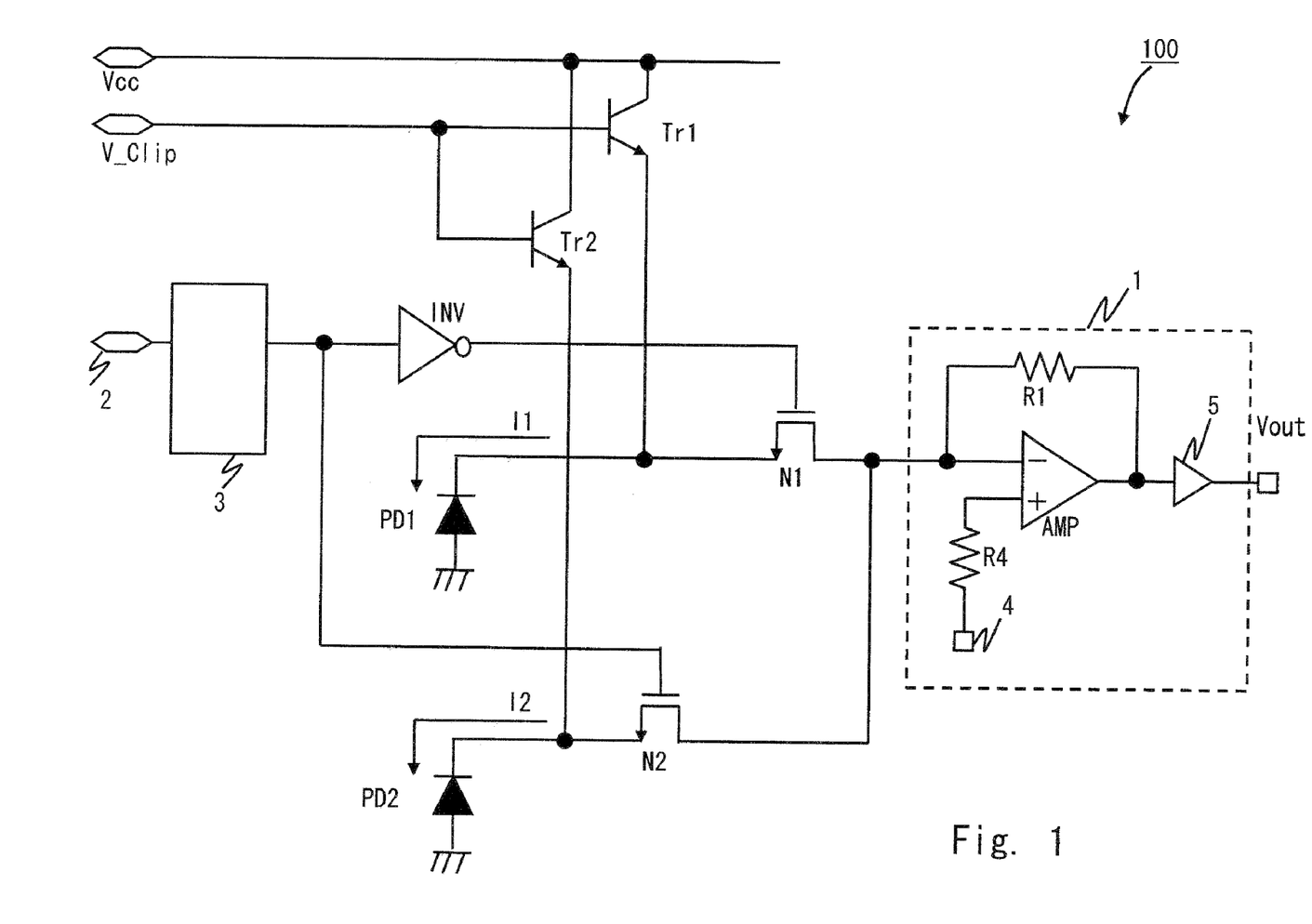
FIG. 1 is a schematic circuit diagram of a light receiving circuit 100 of a first embodiment.

FIG. 1 shows a light receiving circuit 100 according to a first embodiment of the present invention.

As shown in FIG. 1, the light receiving circuit 100 includes photodiodes (light receiving elements) PD1 and PD2, a first terminal Vcc, a second terminal V_Clip, NMOS (N-type Metal Oxide Semiconductor) transistors (switch elements or switches) N1 and N2, bipolar transistors (current supply elements) Tr1 and Tr2, a current-voltage conversion circuit 1 (hereinafter referred to as IV converter 1), a switching terminal 2, a processing circuit 3, and an inverter INV.

Note that the photodiodes PD1 and PD2 form a light receiving unit. Note that the NMOS transistors N1 and N2 form a switch unit. Note that a switching signal is applied to the switching terminal 2. Note that a first power source voltage is applied from a first voltage source to the first terminal Vcc. The first terminal Vcc may be referred to as a first power source voltage terminal. Note that a second power source voltage is applied from a second voltage source to the second terminal V_Clip. The second terminal V_Clip maybe referred to as a second power source voltage terminal V_Clip. The first voltage source is electrically connected to the first terminal Vcc. The second voltage source is electrically connected to the second terminal V_Clip.

The light receiving circuit 100 includes two branches connected to the common input terminal of the IV converter 1 in parallel. The photodiode PD1 and the NMOS transistor N1 form a first branch connected to the input terminal of the IV converter 1. The photodiode PD2 and the NMOS transistor N2 form a second branch connected to the input terminal of the IV converter 1.

Operational modes of the two branches are determined based on the switching signal applied to the switching terminal 2. When the NMOS transistor N1 is in ON state, the first branch is in an active mode. When the first branch is in the active mode, the IV converter 1 coverts a photocurrent generated in the photodiode PD1 to a voltage, and outputs the generated voltage. When the NMOS transistor N2 is in ON state, the second branch is in an active mode. When the second branch is in the active mode, the IV converter 1 converts a photocurrent generated in the PD2 to a voltage, and outputs the generated voltage.

In this embodiment, the bipolar transistors Tr1 and Tr2 are provided for each branch. The first power source voltage is applied to each collector of the transistors Tr1 and Tr2. The second power source voltage is applied to each gate of the transistors Tr1 and Tr2. The bipolar transistors Tr1 and Tr2 are turned on when a cathode potential of the photodiode included in the active branch is decreased to a certain level and when a light is input to the photodiode included in the inactive branch. By adopting this configuration, the above-mentioned problems can be solved.

An anode of the photodiode PD1 is grounded and a cathode thereof is connected to a source of the NMOS transistor N1. A drain of the NMOS transistor N1 is connected to the IV converter 1 and a gate thereof is connected to an output of the processing circuit 3 via the inverter INV. An input of the processing circuit 3 is connected to the switching terminal 2.

An anode of the photodiode PD2 is grounded and a cathode thereof is connected to a source of the NMOS transistor N2. A drain of the NMOS transistor N2 is connected to the IV converter 1 and a gate thereof is connected to the output of the processing circuit 3.

An emitter of the bipolar transistor Tr1 is connected to a node between the photodiode PD1 and the NMOS transistor N1 and a collector thereof is connected to the first terminal Vcc.

An emitter of the bipolar transistor Tr2 is connected to a node between the photodiode PD2 and the NMOS transistor N2 and a collector thereof is connected to the first terminal Vcc. Bases of the first and bipolar transistors Tr1 and Tr2 are connected to the second terminal V_Clip.

The IV converter 1 includes an amplifier AMP, a resistor R1, a resistor R4, a reference terminal 4, a buffer 5, and an output terminal Vout.

The drains of the NMOS transistors N1 and N2 are connected to an inversion input terminal of the amplifier AMP. The resistor R1 is connected between the inversion input terminal of the amplifier AMP and an output terminal of the amplifier AMP. The reference terminal 4 is connected to a non-inversion input terminal of the amplifier AMP via the resistor R4. The buffer 5 is connected between the output terminal of the amplifier AMP and the output terminal Vout.

The operation of the light receiving circuit 100 is described below with reference to FIG. 1 assuming that same voltage level is applied to the second terminal V_Clip and the reference terminal 4.

When the processing circuit 3 outputs a low level signal (hereinafter referred to as L level signal) based on the switching signal applied to the switching terminal 2, the L level signal is applied to the gate of the transistor N2 and then the transistor N2 turns into OFF state. On the other hand, a high level signal (hereinafter referred to as H level signal) is applied to the gate of the transistor N1 when the L level signal is output from the processing circuit 3. The L level signal output from the processing circuit 3 is inverted by the inverter INV, and then the H level signal is applied to the transistor N1.

In this way, the first branch is set to the active mode, resulting in that a photocurrent output from the photodiode PD1 is input to the IV converter 1. On the other hand, the second branch is set to the inactive mode, resulting in that a photocurrent output from the photodiode PD2 is interrupted by the NMOS transistor N2.

With reference to FIGS. 2A to 2D, the operation of the light receiving circuit 100 when the first branch is set to the active mode is further explained. Note that, during a period in which the first branch is set to be active, the IV converter 1 converts a photocurrent generated by the photodiode PD1 and the NMOS transistor N1 is set to be "ON". Note that, a photodiode included in the active branch may also be referred to as an effective photodiode.

Figure 2A:
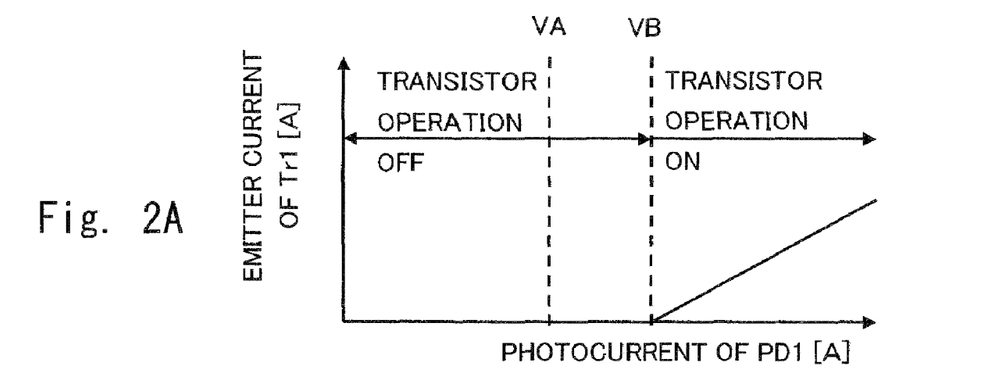
FIG. 2A is a schematic waveform chart of an emitter current of a photodiode PD1 in accordance with an increasing of a photocurrent output from the photodiode PD1.
Figure 2B:
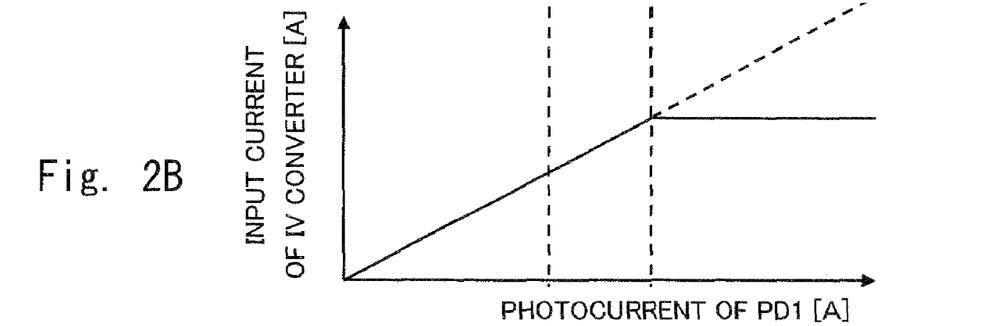
FIG. 2B is a schematic waveform chart of an input current of the IV converter 1 in accordance with an increasing of a photocurrent output from the photodiode PD1.
Figure 2C:
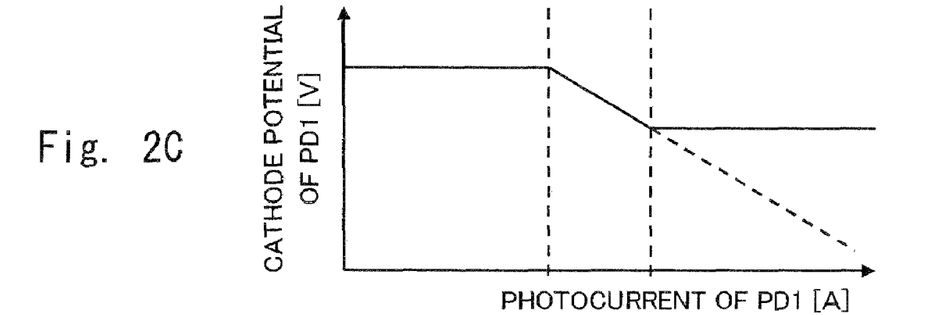
FIG. 2C is a schematic waveform chart of a cathode potential of the photodiode PD1 in accordance with an increasing of a photocurrent output from the photodiode PD1.
Figure 2D:
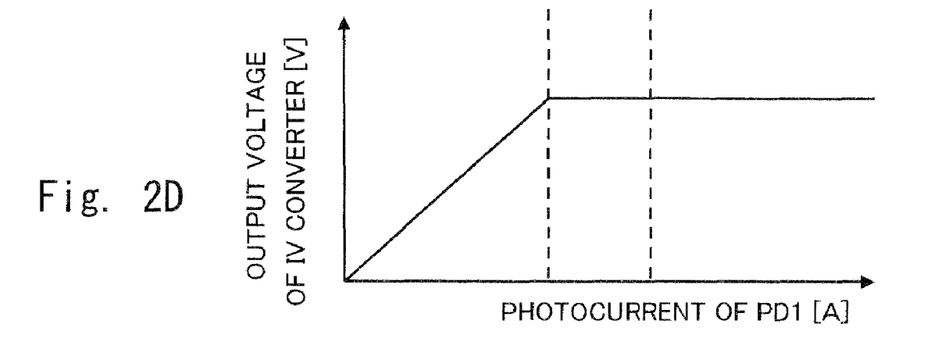
FIG. 2D is a schematic waveform chart of an output of the IV converter 1 in accordance with an increasing of a photocurrent output from the photodiode PD1.

FIG. 2A shows a schematic waveform chart of an emitter current that flows the photodiode PD1 in accordance with an increasing of a photocurrent output from the photodiode PD1. FIG. 2B shows a schematic waveform chart of an input current of the IV converter 1 in accordance with an increasing of a photocurrent output from the photodiode PD1. FIG. 2C shows a schematic waveform chart of a cathode potential of the photodiode PD1 in accordance with an increasing of a photocurrent output from the photodiode PD1. FIG. 2D shows a schematic waveform chart of an output of the IV converter 1 in accordance with an increasing of a photocurrent output from the photodiode PD1. Note that dotted lines shown in FIGS. 2B and 2C represent a waveform where the bipolar transistor Tr1 is not provided.

As shown in FIG. 2D, in response to the increase of the photocurrent output from the photodiode PD1, the output voltage output from the IV converter 1 increases. The output voltage output from the IV converter 1 is then reached to a saturated level at line VA in FIG. 2D where the output voltage is no more increased and limited by the power source voltage applied via the first terminal Vcc.

Before the output voltage of the IV converter 1 reaches to the saturated state, the emitter potential of the bipolar transistor Tr1 (the cathode potential of the photodiode PD1) and the reference terminal 4 are set to be the same voltage level by a virtual short circuit in the amplifier AMP. Because the voltage level of the reference terminal 4 is equal to the voltage level of the second terminal V_Clip, the transistor Tr1 is set to be in OFF state.

When the photocurrent output from the photodiode PD1 further increases and surpasses a certain level enough for saturating the output voltage of the IV converter 1, the cathode voltage of the photodiode PD1 starts to lower as shown in VA-VB of FIG. 2C.

When the potential difference between the cathode potential of the photodiode PD1 and the potential of the second terminal V_Clip becomes enough for turning on the bipolar transistor Tr1, the bipolar transistor Tr1 is automatically turned on. Then, a current is supplied to the cathode of the photodiode PD1. The current supplied from the bipolar transistor Tr1 to the photodiode PD1 corresponds to an amount of the increased current output from the photodiode PD1. In this way, it is possible to prevent the cathode potential of the photodiode PD1 from lowering.

When the photocurrent output from the photodiode PD1 becomes 0 for example, the bipolar transistor Tr1 performs charging rapidly so as to recover the decreased amount of the cathode potential of the photodiode PD1. In this way, it is possible to improve the recovering characteristic of the IV converter based on the operation of the bipolar transistor Tr1.

Figure 3:
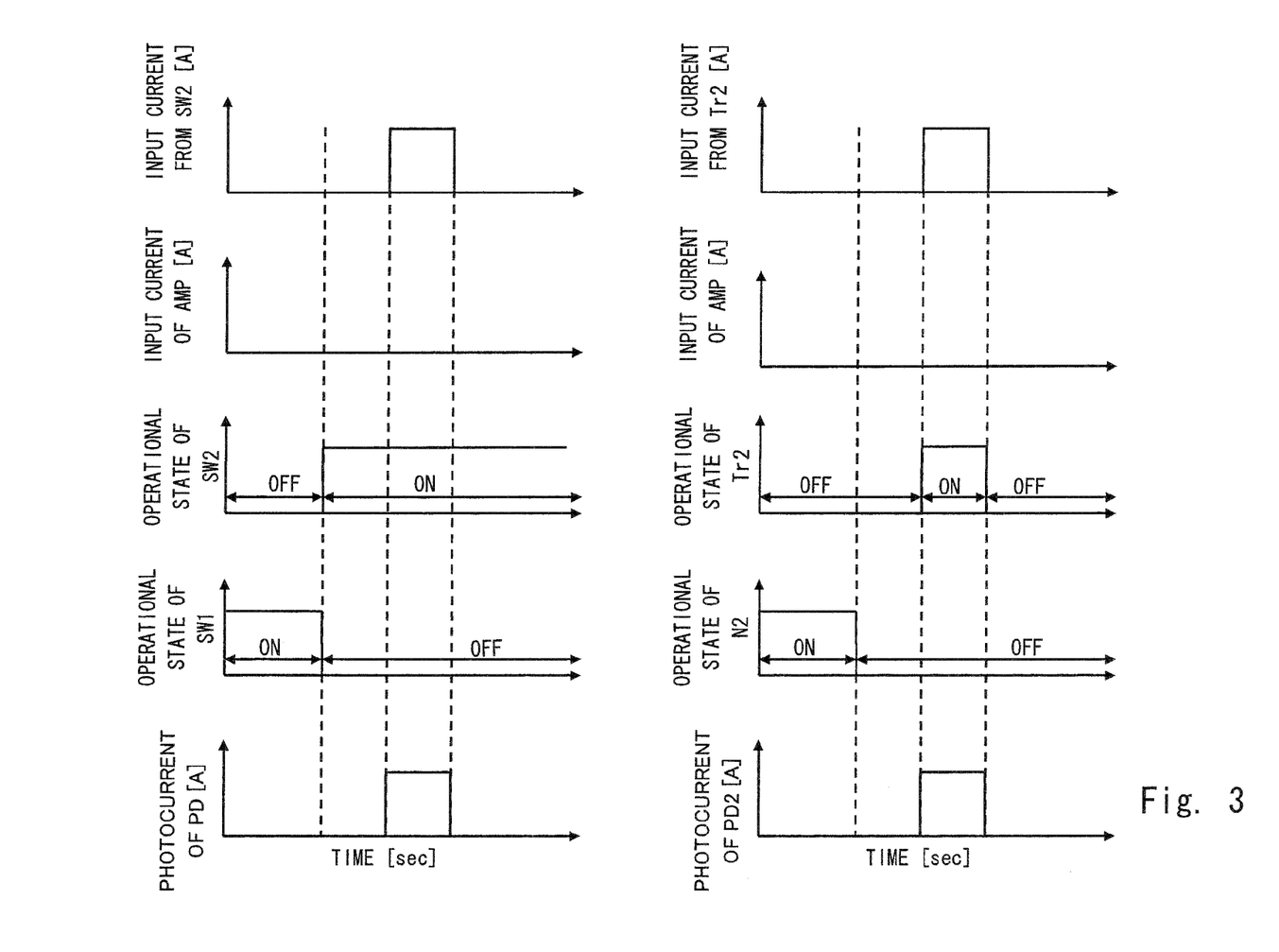
FIG. 3 is a schematic waveform chart in accordance with a photocurrent in the light receiving circuit 100 (Note that a right portion of FIG. 3 relates to the present invention and a left portion of FIG. 3 relates to the prior art 1)

With reference to FIG. 3, the operation of the light receiving circuit 100 in which the second branch is set to be the inactive mode is further explained. Note that, during the period where the second branch is inactive, the photodiode PD2 is set to be ineffective as a result of turning off the NMOS transistor N2. Note that the bipolar transistor Tr2 is in OFF state when no light is input to the photodiode PD2.

FIG. 3 shows a timing chart showing operational states of this embodiment and the prior art 1. Note that a right portion of FIG. 3 relates to the present invention and a left portion of FIG. 3 relates to the prior art 1.

As shown in FIG. 3, in this embodiment, when a light is input to the photodiode PD2, the bipolar transistor Tr2 automatically becomes "ON". Then, a photocurrent I2 flows from the bipolar transistor Tr2 to the photodiode PD2.

In this embodiment, the bipolar transistor Tr2 becomes "ON" corresponding to a period in which the photocurrent is generated. In other words, the bipolar transistor Tr2 becomes "ON" only when a light is input to the photodiode PD2. Note that, in the prior art 1, the switch SW2 is also turned "ON" during a period in which no light is input to the photodiode, thereby increasing a power consumption.

According to the above explained operation, it is achieved to maintain stable source potential of the NMOS transistor N2 even if the photocurrent I2 is generated in the ineffective photodiode PD2. Therefore, it is achieved to cancel the undesired influence (such as Noise and so on) on the IV converter when the photodiode PD2 is changed from the ineffective state to the effective state. This results in that the operations of the selected photodiode PD1 and the IV converter 1 are set to be more stable.

As explained above, in this embodiment, the MOS transistor is used for switching the active branches (effective photodiodes) By adopting this configuration, it is achieved to suppress the increase of circuit size due to the increase in a number of circuit elements (blocks). A low voltage operation is also achieved because the ON resistance of the MOS transistor is small. That is, it is achieved to suppress the loss of the bias voltage of the photodiode.

In this embodiment, the bipolar transistor Tr1 is connected to a node between the photodiode PD1 and the NMOS transistor N1, and the bipolar transistor Tr2 is connected to a node between the photodiode PD2 and the NMOS transistor N2.

By adopting this configuration, it is achieved to supply a current having a corresponding amount with the increased photocurrent generated in the effective photodiode from the bipolar transistor that is turned "ON" to the effective photodiode when the cathode potential of the effective photodiode is decreased enough for turning on the bipolar transistor connected thereto.

In this way, it is achieved to prevent the cathode potential of the effective photodiode from lowering. That is, it is achieved to suppress the undesired influence on the characteristic of the IV converter which is caused when the IV converter 1 outputs the saturated output voltage.

In addition, when the photocurrent I1 output from the photodiode PD1 becomes 0, the bipolar transistor Tr1 performs the charging rapidly to recover the decreased amount of the cathode potential of the photodiode PD1, thereby improving the recovery characteristic after the wide amplitude operation of the IV converter.

It is also achieved to automatically turn on the bipolar transistor Tr2 for generating the photocurrent I2 flowing from the bipolar transistor Tr2 to the photodiode PD2 when a light is input to the ineffective photodiode PD2. It is therefore achieved to maintain the stable source potential of the NMOS transistor N2 and to suppress the undesired influences such as noise and so on to be applied to the IV converter 1.

In the prior art 1, when one of the first and second switches SW1 and SW2 is ON state, the other is in OFF state. In order to perform the complementary operation, an additional circuit for the complementary operation is required, and an additional workload for the designing is also required. On the other hand, in the light receiving circuit of this embodiment, it is possible to cancel the requirement for the additional circuit for the complementary operation and for the additional workload. It is therefore achieved to suppress the increase in the circuit size.

Note that, in this embodiment, the case where the photodiode PD1 is effective and the photodiode PD2 is ineffective is explained. However, the above explanation can be applied to the other case where the photodiode PD1 is ineffective and the photodiode PD2 is effective with certain necessary changes. So, the overlapping explanation is omitted.

Figure 4:
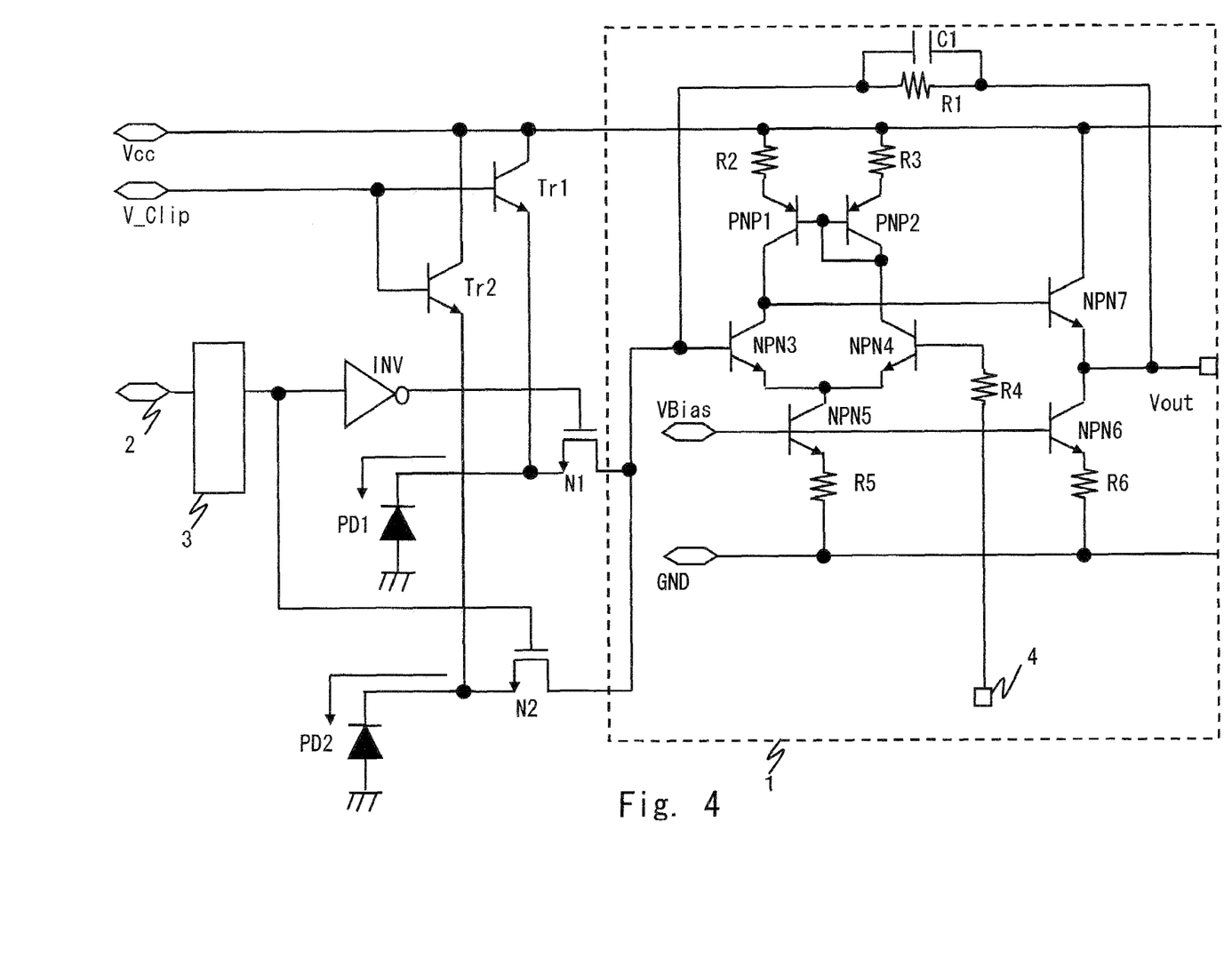
FIG. 4 is a detailed circuit diagram of an IV converter included in the light receiving circuit of a first embodiment.

FIG. 4 shows an exemplary circuit diagram of the IV converter 1 shown in this embodiment. As shown in FIG. 4, the IV converter 1 includes resistors R1 to R6, PNP bipolar transistors PNP1 and PNP2, NPN bipolar transistors NPN3 to NPN7, a capacitor C1, the output terminal Vout, the reference terminal 4, a GND terminal, and a power source voltage terminal VBias.

The transistors PNP1 and PNP2 form a current mirror circuit. A base of the transistor PNP1 is connected to a base of the transistor PNP2. An emitter of the transistor PNP1 is connected to an end of the resistor R2. An emitter of the transistor PNP2 is connected to an end of the resistor R3. The other end of each resistor R2 and R3 is connected to the first terminal (power source terminal) Vcc.

A collector of the transistor PNP1 is connected to a collector of the transistor NPN 3. A collector of the transistor PNP2 is connected to a collector of the transistor NPN4. Emitters of the transistors NPN3 and NPN4 are connected in common.

A base of the transistor NPN3 is connected to the drains of the NMOS transistors N1 and N2. The base of the transistor NPN3 is also connected to an end of the resistor R1. The other end of the resistor R1 is connected to the output terminal Vout of the IV converter 1. The capacitor C1 is connected in parallel with the resistor R1. A base of the transistor NPN4 is connected to an end of the resistor R4. The other end of the resistor R4 is connected to the reference terminal 4 where a reference voltage for the IV converter 1 is applied.

Emitters of the transistors NPN3 and NPN4 are connected in common and also connected to a collector of the transistor NPN5. An emitter of the transistor NPN5 is connected to an end of the resistor R5. The other end of the resistor R5 is connected to the GND terminal. A base of the transistor NPN5 is connected to the power source voltage terminal VBias. A base of the transistor NPN6 is also connected to the power source voltage terminal VBias.

A base of the transistor NPN7 is connected to a node between the transistor PNP1 and the transistor NPN3. A collector of the transistor NPN7 is connected to the first terminal Vcc and an emitter thereof is connected to a collector of the transistor NPN6. An emitter of the transistor NPN6 is connected to an end of the resistor R6 and base thereof is connected to the power source voltage terminal VBias. The other end of the resistor R6 is connected to the GND terminal.

In this IV converter 1, the photocurrent I1 output from the photodiode PD1 is input to the transistor NPN3. In this case, an amount of the current flowing into the base of the transistor NPN7 varies corresponding to a potential difference between the transistors NPN3 and NPN4. A fixed voltage is caused by the transistor NPN6, therefore a voltage caused by the transistor NPN7 is set as the output voltage at the output terminal Vout. In this way, the IV converter 1 converts the input photocurrent into the output voltage.

Second Embodiment

Figure 5:
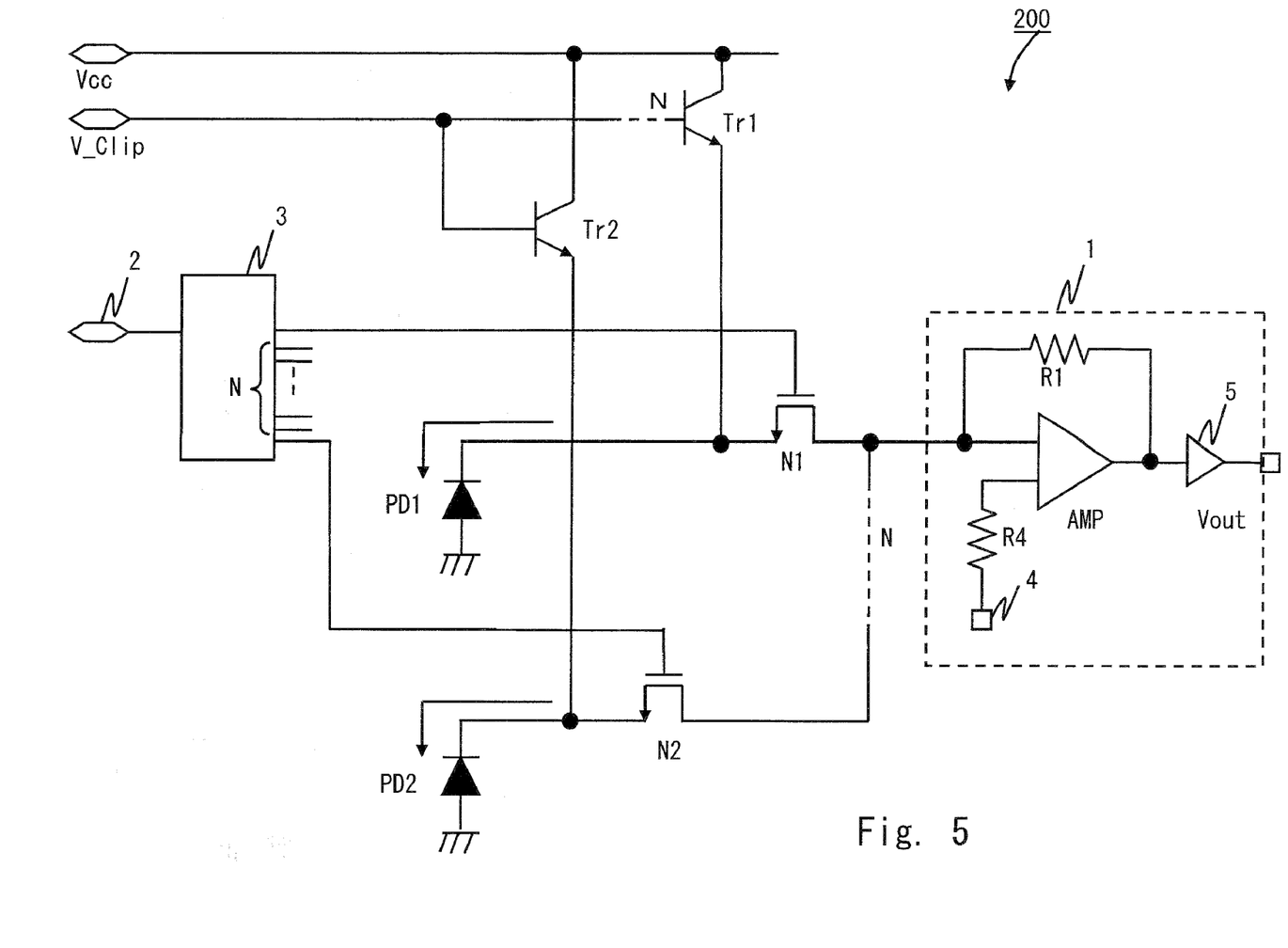
FIG. 5 is a schematic circuit diagram of a light receiving circuit 200 according to a second embodiment.

FIG. 5 shows a light receiving circuit 200 of this embodiment. Note that, like reference numerals in FIG. 5 are used to designate the same components as those of FIG. 1, and the overlapping explanation is omitted.

In the light receiving circuit 100 shown in FIG. 1, by switching the two branches and providing bipolar transistors for each branches, the undesired influence on the IV converter caused by the over-saturated state and the undesired influence on the IV converter caused by the photocurrent when a light is input to the ineffective photodiode are avoided simultaneously. This point is also achieved in this embodiment as in the first embodiment.

In this embodiment, N (N is a natural number of 2 or more) photodiodes are provided, and bipolar transistors and NMOS transistors are provided corresponding to each of the plurality of photodiodes. The IV converter 1 is commonly used among the plurality of photodiodes.

By adopting this configuration, it is achieved to switch the plurality of photodiodes stably without increasing the circuit area required for the IV converter. Note that, the switching operation of the plurality of the photodiodes in this embodiment is performed in a same way as explained in the first embodiment. So, the overlapping explanation is omitted.

It is also possible to change the combination of the switching terminal 2, the processing circuit 3, and the inverter INV. By changing in that way, it is achieved to select a number of effective photodiodes flexibly. Furthermore, it is achieved to set the base potential of the bipolar transistors flexibly. It is therefore achieved to set the potential level as a clip of the cathode voltage of the photodiode. Note that, it is preferable to arrange the switching operation of the branches in accordance with the increase or decrease in a number of branches connected to the common IV converter 1.

It is apparent that the present invention is not limited to the above embodiments, but may be modified and changed without departing from the scope and spirit of the invention.

For example, PMOS transistors can be used instead of the NMOS transistors N1 and N2 by changing the circuit configuration such as changing the position or the number of inverters INV. The bipolar transistors Tr1 and Tr2 are used as current supply elements in this embodiment and the MOS transistors N1 and N2 are used as switch element. But a MOS transistor may be used as the current supply element, and a bipolar transistor may be used as the switch element.

What is claimed is:
1. A light receiving circuit comprising:
a current-voltage conversion circuit;
first and second photodiodes;

a first switch connected between the first photodiode and an input terminal of the current-voltage conversion circuit;
a second switch connected between the second photodiode and the input terminal;
a first bipolar transistor, an emitter thereof being connected to a node between the first switch and the first photodiode, a base thereof being connected to a second voltage source, and a collector thereof being connected to a first voltage source; and
a second bipolar transistor, an emitter thereof being connected to a node between the second switch and the second photodiode, a base thereof being connected to the second voltage source, and a collector thereof being connected to the first voltage source,
wherein the base of the first bipolar transistor and the base of the second bipolar transistor are provided so as to be supplied a same voltage.

2. The light receiving circuit of claim 1, wherein
the first bipolar transistor is turned on when a cathode potential of the first photodiode becomes equal to or below a predetermined level, and
the second bipolar transistor is turned on when a cathode potential of the second photodiode becomes equal to or below a predetermined level.

3. The light receiving circuit of claim 1, wherein
the first bipolar transistor is turned on when a light is input to the first photodiode and the first switch is turned off, and
the second bipolar transistor is turned on when a light is input to the second photodiode and the second switch is turned off.

4. The light receiving circuit of claim 1, wherein
the first and second switches are formed by a MOS switch.

5. The light receiving circuit according to claim 1,
wherein the current-voltage conversion circuit comprises a reference terminal and the same voltage is a same level as a voltage to be applied to the reference terminal.

6. The light receiving circuit according to claim 1,
wherein a first cathode potential of the first photodiode and a second cathode potential of the second photodiode control the first bipolar transistor and the second transistor respectively.

7. The light receiving circuit according to claim 1,
wherein the first bipolar transistor and the second bipolar transistor are a same type.

* * * * *